United States Patent
Zhou et al.

(10) Patent No.: US 11,283,258 B2
(45) Date of Patent: Mar. 22, 2022

(54) FAULT CURRENT MITIGATION METHOD AND SYSTEM FOR SOLID STATE CIRCUIT BREAKER

(71) Applicant: Eaton Intelligent Power Limited, Dublin (IE)

(72) Inventors: Xin Zhou, Wexford, PA (US); Ruppert Russoniello, Sewickley, PA (US); Brian E. Carlson, Gibsonia, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 16/867,640

(22) Filed: May 6, 2020

(65) Prior Publication Data
US 2020/0266624 A1    Aug. 20, 2020

Related U.S. Application Data

(63) Continuation-in-part of application No. PCT/EP2019/025448, filed on Dec. 10, 2019.
(Continued)

(51) Int. Cl.
*H02H 9/02* (2006.01)
*G01R 19/165* (2006.01)
(Continued)

(52) U.S. Cl.
CPC ....... *H02H 9/025* (2013.01); *G01R 19/16528* (2013.01); *G05F 1/462* (2013.01);
(Continued)

(58) Field of Classification Search
CPC ........ H02H 9/002; H02H 9/025; H02H 3/006; H02H 3/025; G01R 19/16528; G05F 1/462; G05F 1/573
(Continued)

(56) References Cited

U.S. PATENT DOCUMENTS

| 6,356,423 | B1* | 3/2002 | Hastings | ................ | H02H 3/087 |
| | | | | | 361/93.2 |
| 7,369,386 | B2* | 5/2008 | Rasmussen | .............. | H05K 1/14 |
| | | | | | 361/93.9 |

(Continued)

FOREIGN PATENT DOCUMENTS

| EP | 2940820 A1 | 11/2015 |
| EP | 3309809 A1 | 4/2018 |

(Continued)

OTHER PUBLICATIONS

Mutzel, T. et al., "New Algorithm for Electronic Short-Circuit Detection", Electrical Contacts—2006. Proceedings of the 52nd IEEE Holm Conference on Electrical Contacts, Sep. 25-27, 2006.

*Primary Examiner* — Yemane Mehari
(74) *Attorney, Agent, or Firm* — Eckert Seamans Cherin & Mellott, LLC

(57) ABSTRACT

A solid state circuit breaker apparatus includes a solid state switch, a current sensor, and a control circuit. The control circuit is programmed to operate the solid state switch by, in response to receipt of a signal from the current sensor indicating that an overcurrent condition exists: (i) using pulse width modulation to generate a set of control pulses; and (ii) using the control pulses to trigger the solid state switch to open and close in a pattern that corresponds to the control pulses, and thus limit an amount of let-through current that the solid state switch may pass to a load. The amount of let-through current that the solid state switch may pass to the load may be, for example, a threshold level above which the overcurrent condition will exist.

23 Claims, 6 Drawing Sheets

Related U.S. Application Data

(60) Provisional application No. 62/777,307, filed on Dec. 10, 2018.

(51) Int. Cl.
    *G05F 1/46*           (2006.01)
    *G05F 1/573*         (2006.01)
    *H02H 3/00*          (2006.01)
    *H02H 3/02*          (2006.01)
    *H02H 9/00*          (2006.01)

(52) U.S. Cl.
    CPC ............. *G05F 1/573* (2013.01); *H02H 3/006* (2013.01); *H02H 3/025* (2013.01); *H02H 9/002* (2013.01)

(58) Field of Classification Search
    USPC ......................................................... 323/277
    See application file for complete search history.

(56) References Cited

U.S. PATENT DOCUMENTS

| | | | |
|---|---|---|---|
| 9,973,085 B2* | 5/2018 | Vicquery | H02M 1/32 |
| 2011/0115460 A1* | 5/2011 | Elliott | H03K 17/78 |
| | | | 323/285 |
| 2014/0184185 A1 | 7/2014 | Torrisi et al. | |
| 2016/0294179 A1* | 10/2016 | Kennedy | H02H 7/261 |
| 2016/0359311 A1 | 12/2016 | Handy et al. | |
| 2017/0256934 A1* | 9/2017 | Kennedy | H02H 7/222 |
| 2019/0089146 A1* | 3/2019 | Li | H02H 7/0822 |

FOREIGN PATENT DOCUMENTS

| | | |
|---|---|---|
| JP | 2003123569 A | 4/2003 |
| WO | 2018109161 A1 | 6/2018 |

\* cited by examiner

FAULT CURRENT MITIGATION METHOD AND SYSTEM FOR SOLID STATE CIRCUIT BREAKER

RELATED APPLICATIONS AND CLAIM OF PRIORITY

This patent document claims priority to, and is a continuation-in-part under 35 U.S.C. § 111(a) of, International Patent Application Number PCT/EP2019/025448, which was filed Dec. 10, 2019. International Patent Application Number PCT/EP2019/025448 claims priority to U.S. provisional patent application No. 62/777,307, filed Dec. 10, 2018, titled "Fault Current Mitigation Method and System for Solid State Circuit Breaker".

BACKGROUND

This disclosure is related to methods and systems for controlling solid state circuit breakers.

Circuit breakers are designed to provide protection for power distribution systems. Circuit breakers safeguard connected electrical devices and conductors against current overloads and short circuits, thereby protecting people and equipment in the field.

When a fault occurs in a low voltage power distribution system, fault current will flow from a source (such as a transformer) through the system to the source of the fault. A low voltage solid state circuit breaker, which in alternating current (AC) systems is typically rated at approximately 600 volts AC (VAC), 480 VAC or 240 VAC, can interrupt a fault very quickly—typically in tens or hundreds of microseconds. This fast reaction time significantly reduces the fault current that flows through the system and thus protects the system. However, it can present a challenge in that the solid state circuit breaker must be able to just as quickly distinguish a fault from a temporary overload (or even high rated current).

This disclosure describes systems that address at least some of the technical issues discussed above, and/or other issues.

SUMMARY

In various embodiments, a solid state circuit breaker apparatus includes a solid state switch, a current sensor, and a control circuit. The control circuit is programmed to operate the solid state switch by, in response to receipt of a signal from the current sensor indicating that an overcurrent condition exists: (i) using pulse width modulation to generate a set of control pulses; and (ii) using the control pulses to trigger the solid state switch to open and close in a pattern that corresponds to the control pulses, and thus limit an amount of let-through current that the solid state switch may pass to a load. The amount of let-through current that the solid state switch may pass to the load may be, for example, a threshold level above which the overcurrent condition will exist.

In some embodiments, the control circuit may be programmed to determine a frequency for the control pulses based on a maximum interruption current level of the solid state switch and circuit power factor. Additionally or in other embodiments, the control circuit may be programmed to determine a frequency for the control pulses based on a trip time of the solid state switch. Additionally or in other embodiments, a frequency for the control pulses may be programmed into the control circuit, and the control circuit may be programmed to determine a trip time for the solid state switch based on a level of the let-through current that the current sensor is detecting.

In various embodiments, the control circuit may include a microprocessor that is configured to generate the set of control pulses, a gate drive circuit that is configured to receive the control pulses from the microprocessor and use the control pulses to trigger the solid state switch to open and close according to the pattern, and a hardware trigger circuit that is electrically connected to the current sensor and the gate drive circuit. The hardware trigger circuit may be configured to receive the signal from the current sensor indicating that the overcurrent condition exists, and also to send a trigger signal to the gate drive circuit to open the solid state switch.

The circuit breaker apparatus may be incorporated into various elements of equipment, such as a transformer having a conductive path leading from the transformer to a load output, in which the circuit breaker's solid state switch is positioned in the conductive path.

In various embodiments, a method for controlling a solid state circuit breaker system to limit current to a load output in overcurrent conditions includes: (i) operating a circuit having a conductive path between a power source and a load output and also having a solid state switch in the conductive path; (ii) by a current sensor, monitoring a level of current through the conductive path and sending a signal to the control circuit indicating that an overcurrent condition exists; (iii) by a control circuit, upon receiving the signal from the current sensor, using pulse width modulation to generate a set of control pulses; and (iv) by the control circuit, using the set of control pulses to trigger the solid state switch to open and close in a pattern that corresponds to the control pulses, wherein the opening and closing of the solid state switch limits a level of let-through current that the solid state switch passes to the load output.

Optionally, the method may include, by the control circuit, using the set of control pulses to trigger the solid state switch to open and close at a specified frequency, wherein the specified frequency controls the level of let-through current that the solid state switch passes to the load output. Alternatively or in addition, the method may include determining the specified frequency for the control pulses based on a maximum interruption current level of the solid state switch and circuit power factor. Alternatively or in addition, the method may include determining a trip time of the solid state switch based on the specified frequency for the control pulses. Alternatively or in addition, the method may include determining a trip time for the solid state switch based on the level of the current that the current sensor is detecting.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

In this document, the terms "memory" and "memory device" each refer to a non-transitory device on which computer-readable data, programming instructions or both are stored. Except where specifically stated otherwise, the terms "memory" and "memory device" are intended to include single-device embodiments, embodiments in which multiple memory devices together or collectively store a set of data or instructions, as well as one or more individual sectors within such devices.

In this document, the terms "processor" and "processing device" refer to a hardware component of an electronic device (such as a controller) that is configured to execute programming instructions. Except where specifically stated otherwise, the singular term "processor" or "processing device" is intended to include both single processing device embodiments and embodiments in which multiple processing devices together or collectively perform a process.

Figure 1:
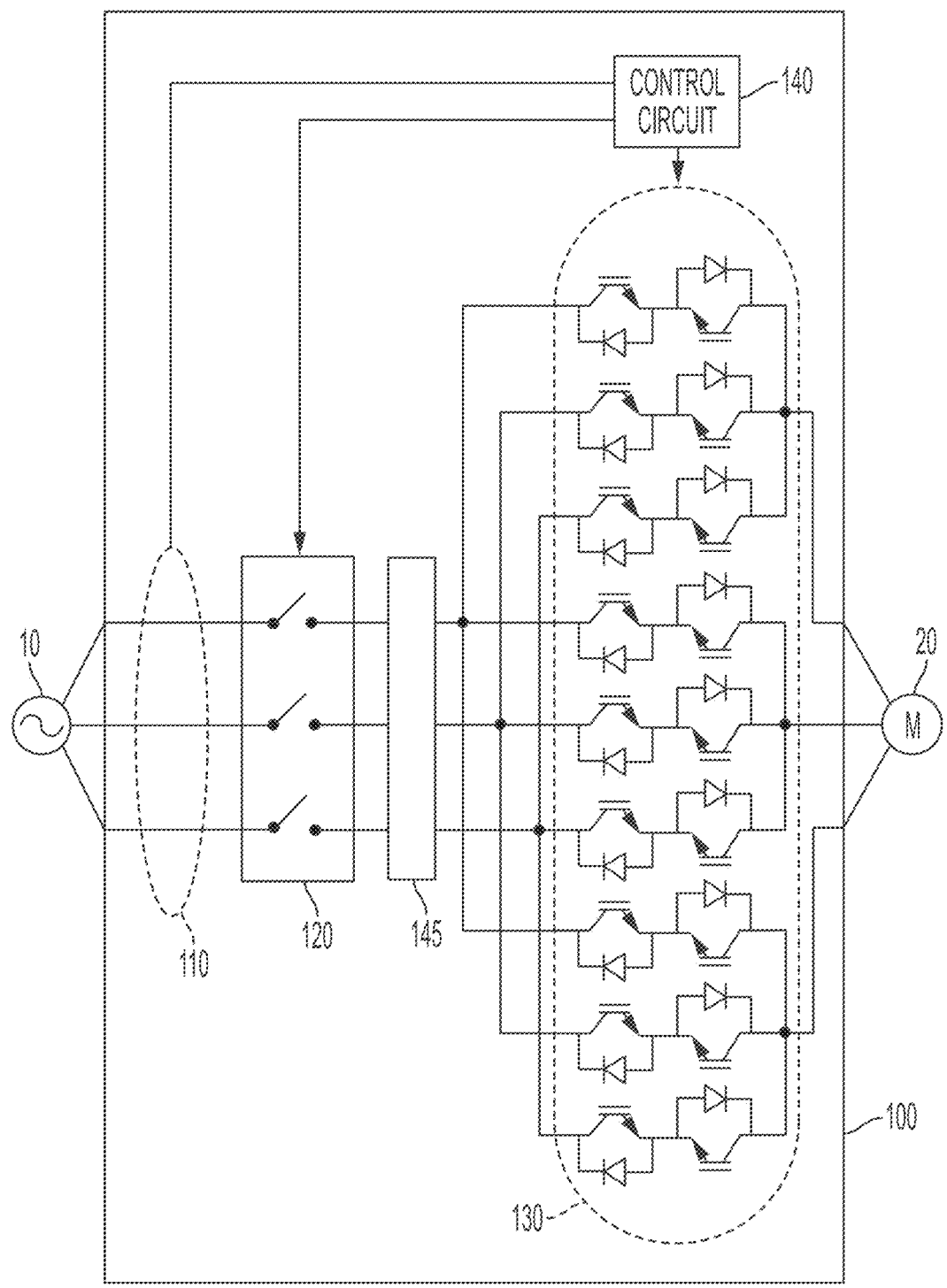
FIG. 1 is a block diagram of components of an example of a system that includes a solid state circuit breaker, such as may exist in the prior art.

FIG. 1 is a block diagram of a system that includes a solid state switch 130. In the system, power is delivered from a power source 10 such as a three-phase transformer to a load 20. The solid state switch 130 is positioned between the power and the load to disconnect the conductive path to the load when the system detects an overcurrent or fault event. The solid state switch 130 may be a conventional solid state relay or it may be a custom design, and it may or may not be bidirectional. As shown the solid state switch 130 may be made of an array of insulated gate bipolar transistors (IGBTs), although in some embodiments other switching components may be used, such as metal-oxide-semiconductor field-effect transistors (MOSFETs) or bipolar junction transistors (BJTs). The system 100 also includes a current sensor 110 and input filter 145 that are positioned between the power supply 10 and the solid state switch 130, along with a control circuit 140. The system also may include an isolation switch 120 that may be opened manually, or in response to a command from the control circuit 140, to ensure that the system is completely de-energized for maintenance.

The control circuit 140 may include a processor, with programming stored as memory and programming instructions (or as firmware or in the form of a programmable logic device such as a field-programmable gate array). The programming is configured to cause the control circuit 140 to issue signals to cause other components of the system to take action in response to certain actions. For example, the control circuit 140 may receive signals from the current sensor 110 that reflect the detected current level, and the control circuit 140 may cause the solid state switch 130 to open in response to detection of an overcurrent condition. Systems such as those of FIG. 1 may exist in the prior art.

Figure 2:
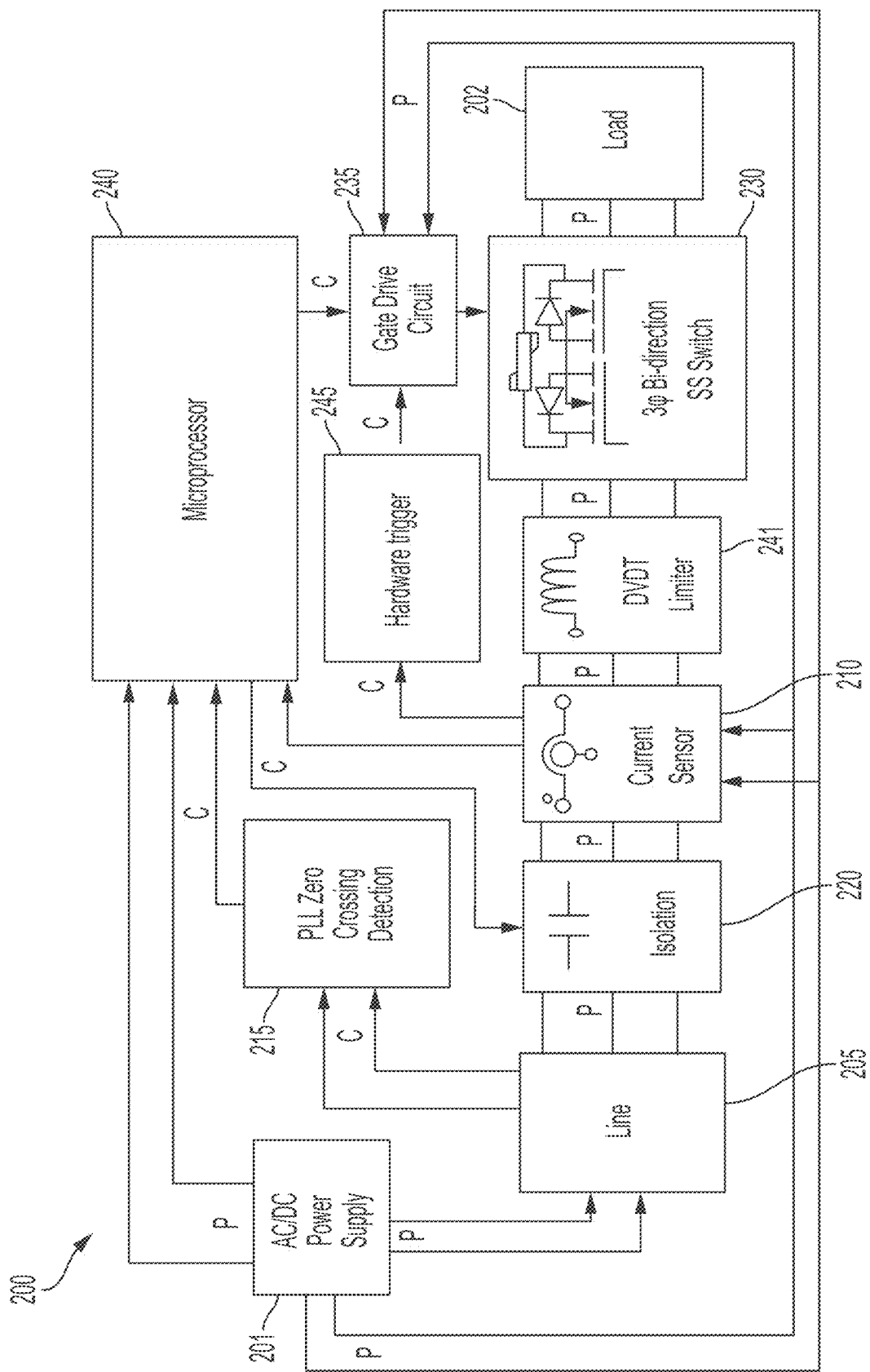
FIG. 2 is a block diagram of components of an example of a system that includes a solid state circuit breaker, with additional components according to the present embodiments.

FIG. 2 provides additional details of an example circuit breaker system 200 with a solid state switch 230 in accordance with the present embodiments. The solid state switch 230 is positioned along a conductive path between the power line input 205 and the load 202. In this example the solid state switch 230 is a three-phase bi-directional solid state switch. The power line input 205 may be connected to a power source. An AC/DC converter power supply 201 harvests power from the power line and powers the electronic components of the circuit, including a microprocessor 240 and a gate drive circuit 235, which will be described below.

A current sensor 210 detects the level of current traveling along the conductive path and provides output signals to the control circuit 240. The control circuit 240 includes a processor and programming instructions to take action in response to receiving an overcurrent signals from the current sensor 210. Such actions may include commanding the solid state switch 230 to open. The control circuit 240 may send such a command signal to a gate drive circuit 235, which amplifies the command signal into a high-current drive input that is sufficient to drive the gates of the transistors in the solid state circuit breakers.

The system also may include an isolation switch 220 that may be opened to de-energize the circuit and provide galvanic isolation for maintenance. An inductor 241 may be positioned in the conductive path near the solid state switch 230 to serve as a rate of current change (dI/dt) limiter and provide additional protection against sudden faults. A phase-locked loop (PLL) 215 may be connected to the conductive path to help the system measure the power frequency via zero crossing detection. The PLL 215 may provide the zero crossing information to the control circuit 240 which may use that information to measure the frequency of the line voltage and phase angle.

The system may include a hardware trigger circuit 245, which is an analog circuit that receives as its input a current signal from current sensor 210, and which uses comparators to compare the current signal to a predefined threshold. If the current signal level is higher than the predefined threshold, the hardware trigger circuit 245 will send a trigger signal to gate drive circuit 235 to open the solid state breaker (switch 230). This reduces or minimizes the time delay that is caused by the microprocessor circuit.

As noted in the Background section of this document, one issue with solid state circuit breakers is that they may not be able to distinguish an overload current or a high rated current or a brief spike in current from a fault condition in just a few microseconds or tens of microseconds. In traditional approaches, the solid state circuit breaker needs to trip nearly instantaneously in response to detecting current that exceeds a threshold so that the power electronic switch will not be damaged by the high current. This may result in the circuit breaker tripping in situations where it may not need to do so. In such situations, it may be desirable to keep the circuit operating for a period of time before fully triggering the solid state circuit breaker to open and remain open.

Figure 3A:
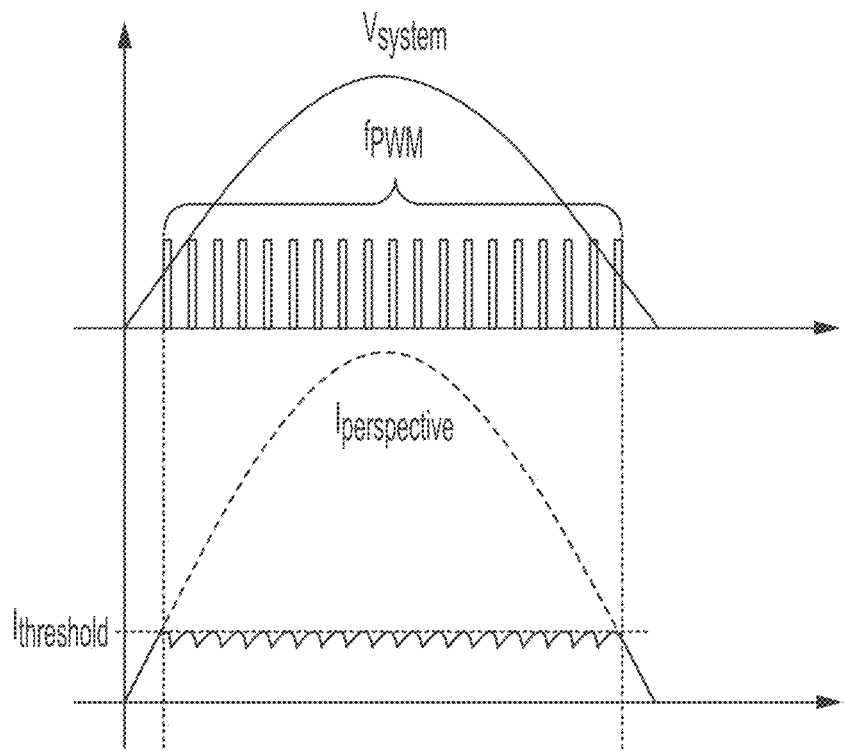
FIGS. 3A and 3B illustrate a first method of controlling a solid state circuit breaker.
Figure 3B:
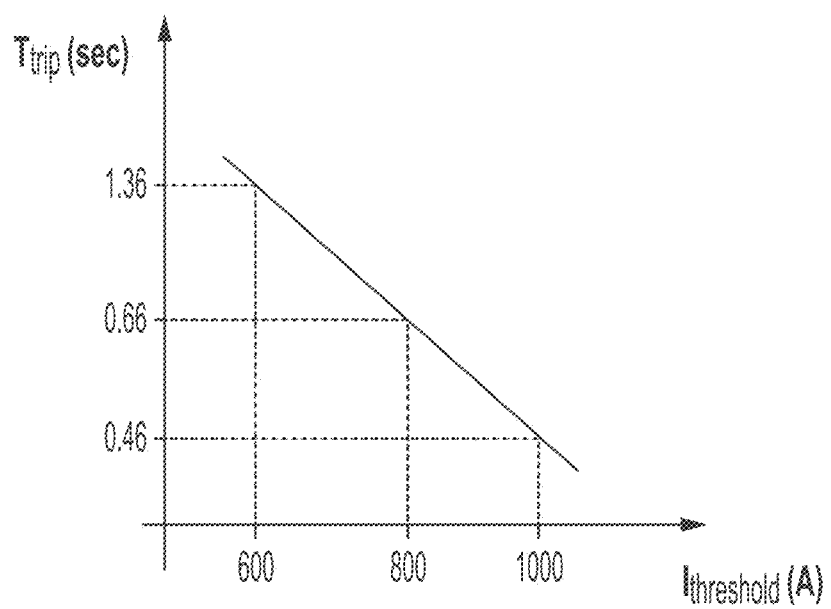

FIGS. 3A and 3B illustrate a first method by which a circuit breaker system such as that described above may mitigate fault current and other overcurrent conditions and allow the circuit to continue operating for a period of time in a reduced current condition before (or in lieu of) triggering the solid state switch. As illustrated in FIG. 3A, when the system detects an overcurrent condition ($I_{perspective} > I_{threshold}$) by receiving a signal of the condition from the current sensor, the processor uses pulse width modulation (PWM) to generate a control pulse at a frequency $f_{PWM}$ that will limit let-through current by the solid state switch. Rather than just triggering the circuit breaker to open and remain open, the control pulses will trigger the solid state switch breaker to open and close at a frequency that will effectively control the current that the circuit breaker lets through so that the current does not exceed a threshold level $I_{threshold}$. As illustrated in FIG. 3B, the control circuit may be programmed to dynamically determine a trip time for the solid state circuit breaker as an inverse function of the threshold current level $I_{threshold}$. (The numeric values shown in FIG. 3B follow an example that will be discussed in the context of FIGS. 4A and 4B.) Alternatively, the trip time $t_{trip}$ of the circuit breaker may be determined as a function of the frequency of the PWM pulses $f_{PWM}$ (i.e., the lower the frequency of the PWM pulses, the higher the trip time). In these ways, rather than passing the full potential current $I_{perspective}$ through to the load, the solid state circuit breaker would limit its let-through current to a maximum threshold level $I_{threshold}$.

Figure 4A:
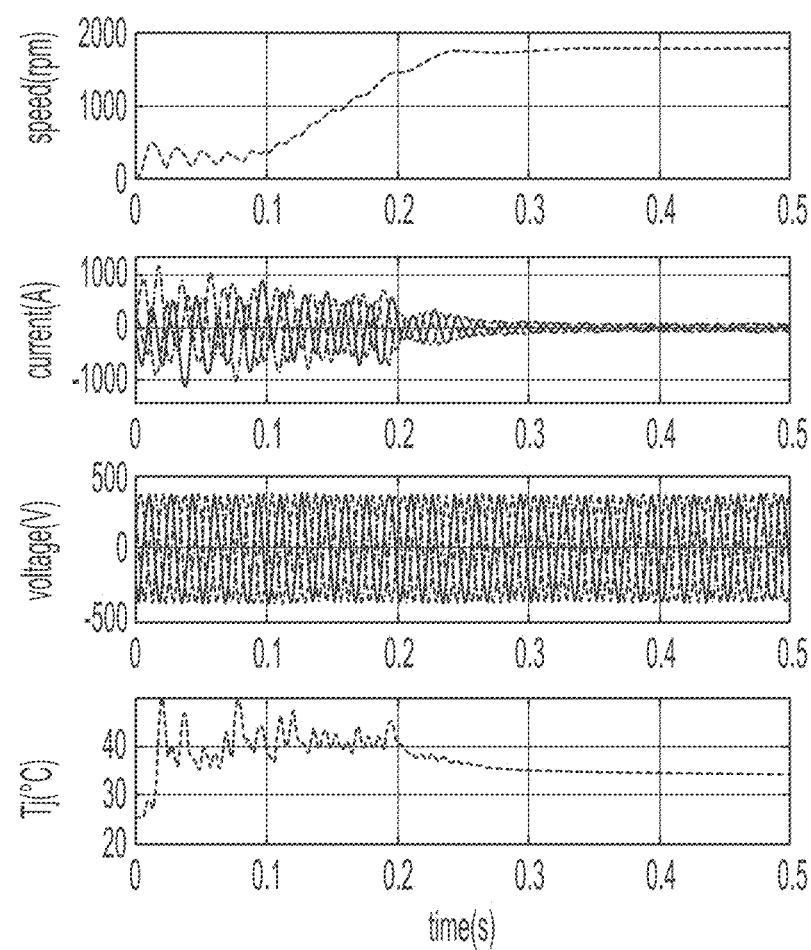
FIGS. 4A and 4B illustrate an example application of the method illustrated in FIGS. 3A and 3B to an induction motor with a direct on line starter.
Figure 4B:
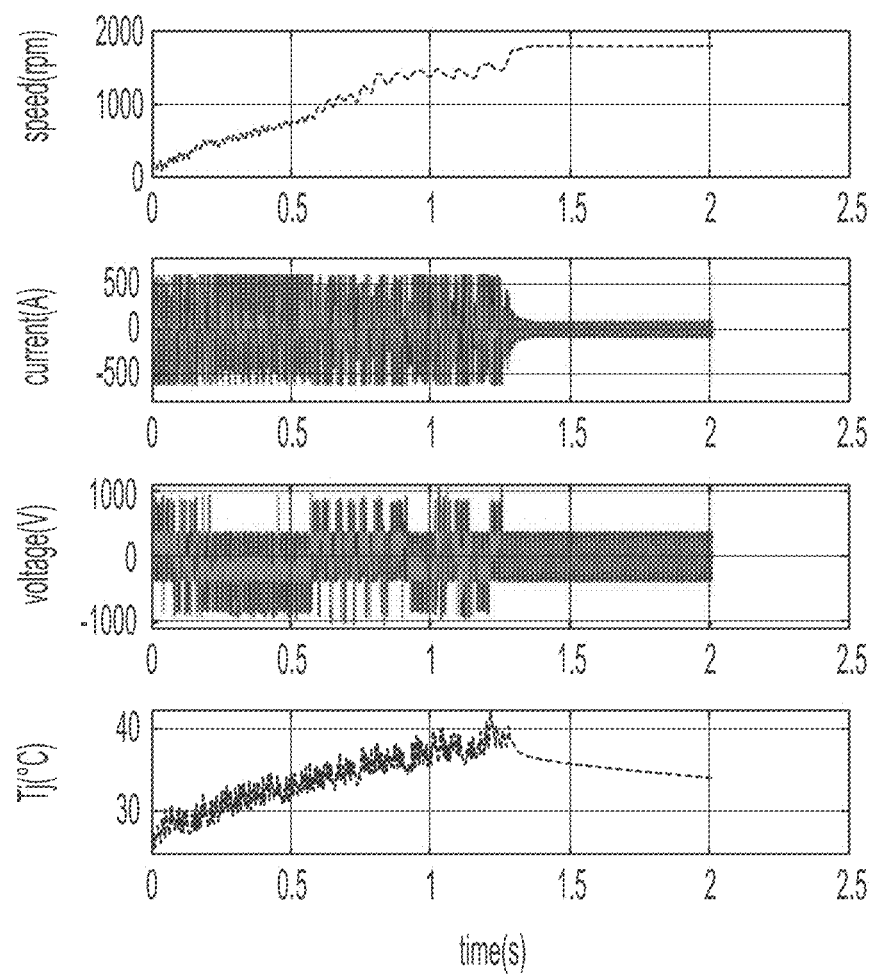

FIGS. 4A and 4B illustrate an example application of the method of FIGS. 3A and 3B in which an induction motor is started using a direct on line (DOL) starter. In this example, the motor is rated 75 kVA and operates at 1800 rotations per minute (rpm). As illustrated in FIG. 4A, in typical operation when the motor starts it will draw a peak current of approximately 1200 amps (A), and then settle to its normal operation with a nominal 67 $A_{rms}$ after about 0.24 seconds. When the method of FIGS. 3A and 3B is applied, FIG. 4B illustrates that the method limits inrush current to approximately 600 A. In normal operation the current will drop to its nominal 67 $A_{rms}$ after about 1.3 seconds when the motor reaches approximately 1800 rpm. However, with this method if there is a short circuit event the current will remain at a maximum of 600 A after the 1.3 second startup period. In addition, referring back to FIG. 3B, the trip time $T_{trip}$ is an inverse function of the current threshold $I_{threshold}$. If the current threshold $I_{threshold}$ is 600 A as discussed in the example above, the trip time $T_{trip}$ is 1.36 seconds. However, if the current threshold $I_{threshold}$ is higher, the trip time $T_{trip}$ will be faster. For example, in the example shown in FIG. 3B if $I_{threshold}$ is 800 A then $T_{trip}$ will be 0.66 seconds; if $I_{threshold}$ is 100 A then $T_{trip}$ will be 0.46 seconds.

Figure 5A:
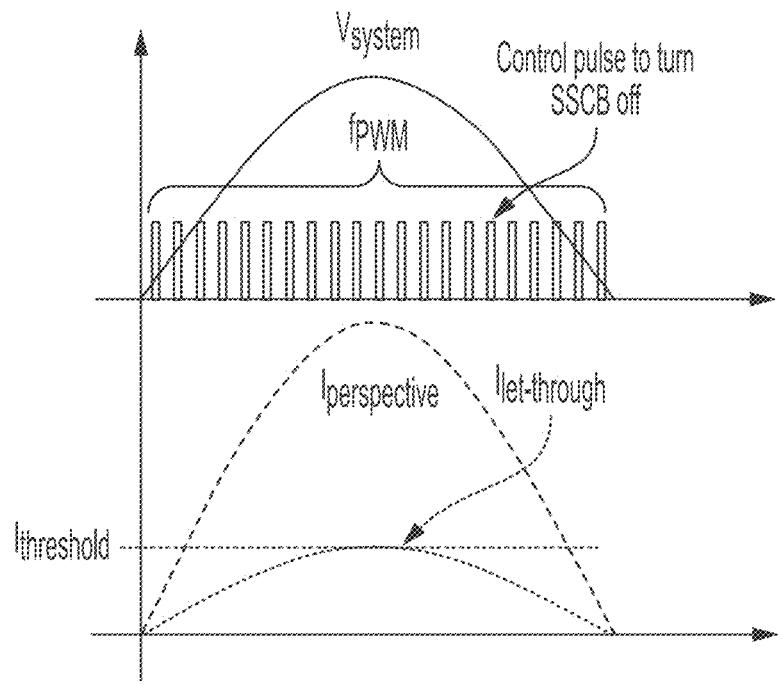
FIGS. 5A and 5B illustrate a second method of controlling a solid state circuit breaker.
Figure 5B:
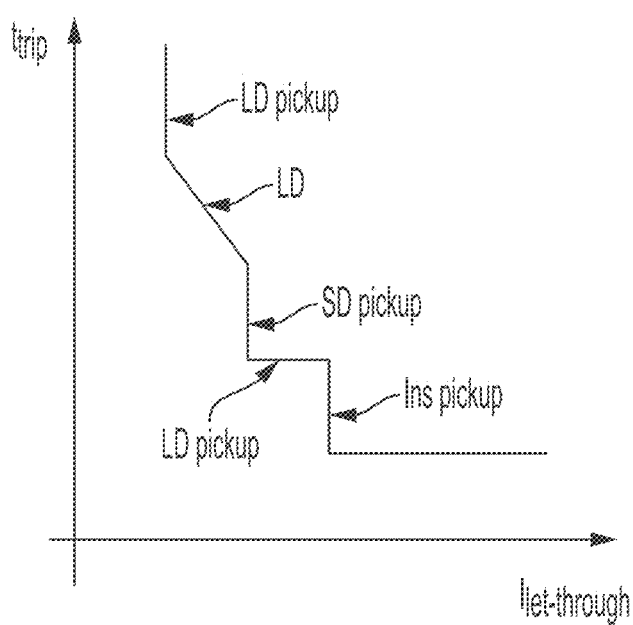

FIGS. 5A and 5B illustrate an alternate method by which a system such as that described above shown may mitigate fault current and other overcurrent conditions. As with the embodiment of FIG. 3A, in this embodiment FIG. 5A illustrates that the processor uses PWM to generate a control pulse at a predefined frequency that will limit let-through current by the solid state circuit breaker. In this case the PWM need not be triggered by an overcurrent condition, but instead may be initiated as soon as or shortly after the breaker closes. Or, the system may trigger PWN upon detecting current of a threshold level (such as a percentage of rated capacity) that is not necessarily an overcurrent condition. The PWM pulses will trigger the solid state switch to open and close at a defined frequency that will effectively control the current that the circuit breaker lets through so that the current does not exceed a threshold level $I_{threshold}$ that the solid state switch can withstand. For example, the threshold level $I_{threshold}$ may be a current level that is within the safe operating area of power electronic components of the switch such as insulated-gate bipolar transistors (IGBTs) or metal-oxide semiconductor field-effect transistors (MOSFETs). During operation, rather than maintaining the let-through current $I_{let\_through}$ at a constant maximum level, the let-through current $I_{let-through}$ will vary as the perspective fault current $I_{perspective}$ varies, with a peak at the maximum threshold level $I_{threshold}$ corresponding to the maximum breaker interruption current level. The trip time $t_{trip}$ of the circuit breaker is a function of the let-through current curve $I_{let-through}$, with: (i) a first period of long delay (LD pickup, associated with a low level of fault), followed by a short delay as the fault level increases, followed by an instantaneous trip when the let-through current reaches the maximum threshold $I_{threshold}$.

In either of the embodiments listed above, the system may continue to operate the circuit breaker in this way up to a maximum period of time, or for a maximum number of current cycles. If the fault continues past the maximum time or cycles, the controller may trigger the circuit breaker to open and remain open until the fault is cleared.

In addition, in either of the embodiments listed above, the system may or may not continue to monitor the current profile (i.e., the variation in current over time), but instead may only monitor instantaneous current, or it may not monitor current at all when PWM is triggered.

The controller may further wait for a predefined period of time after the fault is cleared to reclose. The solid state circuit breaker may perform the same operation to the maximum period of time, or for the maximum number of current cycles, and after doing so it will reclose. If the fault persists past the maximum time or cycles, the controller may trigger the circuit breaker to open. The solid state circuit breaker may repeat this operation with different predefined or dynamically determined periods of times for one or more additional operations before it finally interrupts the fault and remains open, or it may reclose the circuit if the fault is gone.

The methods of operating a solid state circuit breaker described above, and circuits programmed to implement such methods, may be added to various power equipment items, such as transformers, reclosers, and other products. In addition, the methods and systems described above are not limited to low voltage applications, but could also be used in medium voltage applications that employ solid state or hybrid breakers, reclosers and the like.

Various alternatives, modifications, variations or improvements, and combinations may be made by those skilled in the art, each of which is also intended to be encompassed by, the disclosed embodiments.

The invention claimed is:

1. A solid state circuit breaker apparatus comprising:
   a solid state switch;
   a current sensor; and
   a control circuit,
   wherein the control circuit is programmed to operate the solid state switch by, in response to receipt of a signal from the current sensor indicating that an overcurrent condition exists:
      using pulse width modulation to generate a set of control pulses at a frequency, wherein the frequency is programmed into the control circuit,
      using the control pulses to trigger the solid state switch to open and close in a pattern that corresponds to the control pulses, and thus limiting an amount of let-through current that the solid state switch may pass to a load, and
      determining a trip time of the solid state switch based on a level of the let-through current that the current sensor is detecting.

2. The circuit breaker apparatus of claim 1, wherein the control circuit is programmed to determine the trip time of the solid state switch based also on the frequency for the control pulses.

3. The circuit breaker apparatus of claim 1, wherein the control circuit comprises:
   a microprocessor that is configured to generate the set of control pulses;
   a gate drive circuit that is configured to receive the control pulses from the microprocessor and use the control pulses to trigger the solid state switch to open and close according to the pattern; and a hardware trigger circuit that is electrically connected to the current sensor and the gate drive circuit, and that is configured to:
receive the signal from the current sensor indicating that the overcurrent condition exists, and
send a trigger signal to the gate drive circuit to open the solid state switch.

4. The circuit breaker apparatus of claim 1, wherein the amount of let-through current that the solid state switch may pass to the load is a threshold level above which the overcurrent condition will exist.

5. The circuit breaker apparatus of claim 1, wherein the apparatus does not monitor current profile through the circuit breaker apparatus when the control pulses are triggering the solid state switch to open and close.

6. A transformer apparatus with a solid state circuit breaker apparatus, the transformer apparatus comprising:
a transformer;
a conductive path leading from the transformer to a load output;
a solid state switch in the conductive path;
a current sensor positioned in the conductive path between the transformer and the solid state switch; and
a control circuit,
wherein the control circuit is programmed to operate the solid state switch by, in response to receipt of a signal from the current sensor indicating that an overcurrent condition exists:
using pulse width modulation to generate a set of control pulses at a frequency, wherein the frequency is programmed into the control circuit,
using the control pulses to trigger the solid state switch to open and close in a pattern that corresponds to the control pulses, and thus limit an amount of let-through current that the solid state switch may pass to a load, and
determining a trip time of the solid state switch based on a level of the let-through current that the current sensor is detecting.

7. The transformer apparatus of claim 6, wherein the control circuit is programmed to determine the trip time of the solid state switch based also on the frequency for the control pulses.

8. The transformer apparatus of claim 6, wherein the control circuit comprises:
a microprocessor that is configured to generate the set of control pulses;
a gate drive circuit that is configured to receive the control pulses from the microprocessor and use the control pulses to trigger the solid state switch to open and close according to the pattern; and
a hardware trigger circuit that is electrically connected to the current sensor and the gate drive circuit, and that is configured to:
receive the signal from the current sensor indicating that the overcurrent condition exists, and
send a trigger signal to the gate drive circuit to open the solid state switch.

9. The transformer apparatus of claim 6, wherein the amount of let-through current that the solid state switch may pass to the load is a threshold level above which the overcurrent condition will exist.

10. The method of claim 9, further comprising determining a trip time for the solid state switch based on the level of the current that the current sensor is detecting.

11. The transformer apparatus of claim 6, wherein the apparatus does not monitor current profile through the solid state switch when the control pulses are triggering the solid state switch to open and close.

12. A method for controlling a solid state circuit breaker system to limit current to a load output in overcurrent conditions, the method comprising:
operating a circuit having a conductive path between a power source and a load output and also having a solid state switch in the conductive path;
by a current sensor, monitoring a level of current through the conductive path and sending a signal to the control circuit indicating that an overcurrent condition exists;
by a control circuit:
determining a frequency for a set of control pulses based on a maximum interruption current level of the solid state circuit breaker apparatus and circuit power factor, and
upon receiving the signal from the current sensor, using pulse width modulation to generate the set of control pulses at the frequency; and
by the gate drive circuit, using the set of control pulses to trigger the solid state switch to open and close in a pattern that corresponds to the control pulses, wherein the opening and closing of the solid state switch limits a level of let-through current that the solid state switch passes to the load output.

13. The method of claim 12, further comprising:
by the control circuit, using the set of control pulses to trigger the solid state switch to open and close at the frequency, wherein the frequency controls the level of let-through current that the solid state switch passes to the load output.

14. The method of claim 12, further comprising determining a trip time of the solid state switch based on the frequency for the control pulses.

15. The method of claim 12, wherein:
the control circuit comprises:
a microprocessor,
a gate drive circuit that is electrically connected to the microprocessor and to the solid state switch, and
a hardware trigger circuit that is electrically connected to the current sensor and to the gate drive circuit; and
wherein:
generating the set of control pulses is performed by the microprocessor;
using the set of control pulses to trigger the solid state switch to open and close in the pattern is performed by the gate drive circuit, and
the method further comprises, by the hardware trigger circuit, sending a trigger signal to the gate drive circuit to open the solid state switch in response to receiving the signal from the current sensor indicating that the overcurrent condition exists.

16. The method of claim 12, wherein the amount of let-through current that the solid state switch passes to the load output is a threshold level above which the overcurrent condition will exist.

17. The method of claim 12, further comprising dynamically determining the amount of let-through current that the solid state switch may pass to the load output as perspective fault current of the solid state switch.

18. The method of claim 12, further comprising not monitoring current profile through the circuit when the control pulses are triggering the solid state switch to open and close.

19. A solid state circuit breaker apparatus comprising:
a solid state switch;
a current sensor; and
a control circuit,
wherein the control circuit is programmed to operate the solid state switch by, in response to receipt of a signal from the current sensor indicating that an overcurrent condition exists:
using pulse width modulation to generate a set of control pulses at a frequency,
using the control pulses to trigger the solid state switch to open and close in a pattern that corresponds to the control pulses, and thus limiting an amount of let-through current that the solid state switch may pass to a load, and
determining a trip time of the solid state switch based on the frequency for the control pulses.

20. The circuit breaker apparatus of claim 19, wherein the circuit breaker apparatus is part of a transformer apparatus.

21. The circuit breaker apparatus of claim 19, wherein the control circuit is programmed to determine the frequency for the control pulses based on a maximum interruption current level of the solid state circuit breaker apparatus and circuit power factor.

22. The circuit breaker apparatus of claim 19, wherein the control circuit comprises:
a microprocessor that is configured to generate the set of control pulses;
a gate drive circuit that is configured to receive the control pulses from the microprocessor and use the control pulses to trigger the solid state switch to open and close according to the pattern; and
a hardware trigger circuit that is electrically connected to the current sensor and the gate drive circuit, and that is configured to:
receive the signal from the current sensor indicating that the overcurrent condition exists, and
send a trigger signal to the gate drive circuit to open the solid state switch.

23. The circuit breaker apparatus of claim 19, wherein the amount of let-through current that the solid state switch may pass to the load is a threshold level above which the overcurrent condition will exist.

* * * * *